(12) United States Patent
Hayashi et al.

(10) Patent No.: US 6,192,579 B1
(45) Date of Patent: Feb. 27, 2001

(54) TAPE CARRIER AND MANUFACTURING METHOD THEREFOR

(75) Inventors: Mamoru Hayashi; Kiyokazu Sato; Hirofumi Uchida; Yoshinori Miyajima, all of Nagano (JP)

(73) Assignee: Shinko Electric Industries Co., Ltd., Nagno (JP)

( * ) Notice: Subject to any disclaimer, the term of this patent is extended or adjusted under 35 U.S.C. 154(b) by 0 days.

(21) Appl. No.: 09/211,797

(22) Filed: Dec. 15, 1998

(30) Foreign Application Priority Data

Dec. 16, 1997 (JP) .................................................... 9-346773
May 18, 1998 (JP) ................................................. 10-135196

(51) Int. Cl.⁷ .................................................... H05K 3/02
(52) U.S. Cl. ................................. 29/846; 29/852; 29/825; 174/262
(58) Field of Search ............................ 29/846, 852, 825; 174/262

(56) References Cited

U.S. PATENT DOCUMENTS

| | | | |
|---|---|---|---|
| 4,961,806 | * 10/1990 | Gerrie et al. | 156/252 |
| 5,197,184 | * 3/1993 | Crumly et al. | 29/846 |
| 5,263,353 | * 11/1993 | Bakermans et al. | 72/334 |
| 5,295,299 | * 3/1994 | Takahashi | 29/853 |
| 5,515,604 | * 5/1996 | Horine et al. | 29/830 |
| 5,706,684 | * 1/1998 | Gong et al. | 72/42 |
| 5,950,305 | * 9/1999 | Roberts | 29/848 |
| 6,000,129 | * 12/1999 | Bhatt et al. | 29/852 |
| 6,009,620 | * 1/2000 | Bhatt et al. | 29/852 |

FOREIGN PATENT DOCUMENTS

| | | |
|---|---|---|
| 197 08 254 A1 | 9/1997 | (DE) . |
| 5 235 108 | 9/1993 | (JP) . |
| 5-243338 | 9/1993 | (JP) . |
| 559 384 | 9/1993 | (EP) . |
| 561 620 | 9/1993 | (EP) . |

OTHER PUBLICATIONS

Norwood, E. et al.; "Manufacturing Process for Hybrid Microcircuits Containing Vias". 26ᵗʰ Electronic Components Conference, Apr. 26–28, 1976, pp. 18–31, XP–002122018, San Francisco., p. 18, col. 1, para. 1–3.

* cited by examiner

Primary Examiner—Allan N. Shoap
Assistant Examiner—Ronda E Sands
(74) Attorney, Agent, or Firm—Pennie & Edmonds LLP

(57) ABSTRACT

There is provided a tape carrier in which the degree of freedom of a fine wiring pattern is enhanced by reducing the diameter of a via pad so that the pitch of the wiring pattern can be made fine, and a metallic ball can be positively joined to the via pad even if the diameter of the metallic ball is extended to as large as possible. A tape carrier comprises: a metallic wiring 3 formed on one side of a tape base material 1 through an adhesive layer 2; and a plurality of via holes 4 formed on the other side of the tape base material 1, via pads 3b of the metallic wiring 3 being exposed to the plurality of via holes 4, wherein internal wall surfaces of the via holes, which have been formed by punching the tape material 5, on one side of which the adhesive layer 2 is formed, are subjected to coining-press from the other side of the tape base material 1, so that the via holes 4 are formed into tapered holes 7, the diameters of the opening portions 6 of which are extended.

7 Claims, 9 Drawing Sheets

TAPE CARRIER AND MANUFACTURING METHOD THEREFOR

BACKGROUND OF THE INVENTION

1. Field of the Invention

The present invention relates to a tape carrier and a manufacturing method thereof. More particularly, the present invention relates to a tape carrier, on the tape base material of which a plurality of metallic wires are formed through an adhesive layer, and in the tape base material of which a plurality of via holes communicated with the metallic wires are formed. Also, the present invention relates to a method of manufacturing the tape carrier.

2. Description of the Related Art

Recently, semiconductor elements such as IC chips are highly integrated and mounted on electronic devices at high density. In accordance with that, various semiconductor devices (tape carrier packages), in which tape carriers are used, have been developed and put into practical use. Concerning the material used for the tape carrier (TCP), three layer tapes are commonly used, on which a layer of copper foil is made to adhere onto an insulating tape base material made of polyimide through an adhesive layer.

Description will be given to a common manufacturing method of BGA (Ball Grid Array) type tape carrier in which the above three layer tape is used. First, in a tape material in which an adhesive layer is formed on a base material made of polyimide, punching to form various openings is conducted so that device holes, outer lead holes, via holes and sprocket holes are formed.

Next, a layer of copper foil is laminated on the side of the tape material, which has been punched and on which the adhesive layer is formed, so that a three layer tape can be formed. The above copper foil is subjected to photolithography of the prior art, and a wiring pattern is formed using the copper foil. The above wiring pattern is subjected to tin plating, solder plating, nickel plating or gold plating. Then, solder balls are put on the via pads exposed to the via holes and reflowed so that the solder bumps are formed. In this way, the tape carrier is manufactured.

In the above method of manufacturing the tape carrier, the tape material is punched. Examples of the punching method are: a punching method conducted by a press, a method of forming holes by means of laser beams, and a method of forming holes by means of etching.

From the viewpoint that the number of manufacturing processes is small and the production cost is low, the punching method conducted by a press is preferably used. In the case of punching a tape material, on the polyimide base material of which the adhesive layer is formed, when punching is conducted from the polyimide base material side, a burr of the adhesive layer is generated. Therefore, punching is commonly conducted from the adhesive layer side to the polyimide base material side.

Figure 9:
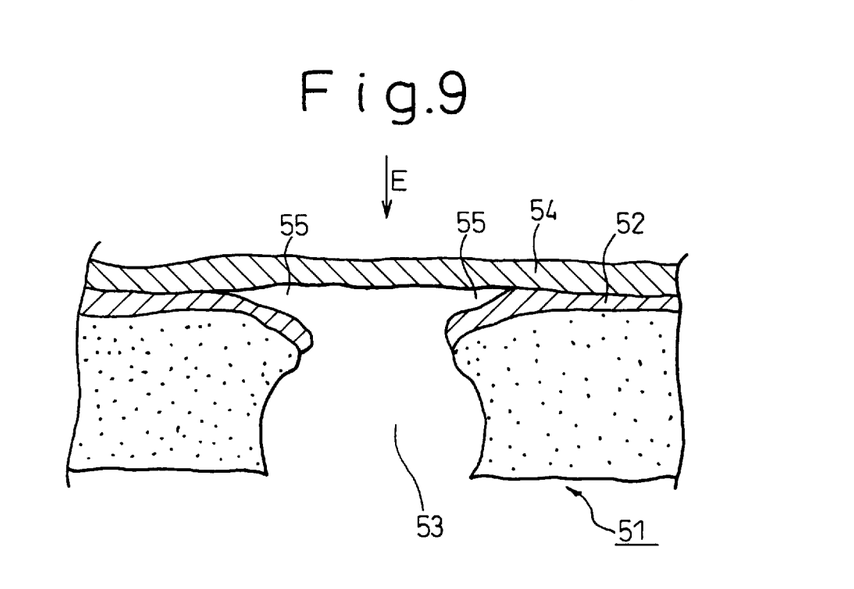
FIG. 9 is an enlarged schematic illustration showing a conventional three layer tape in which a layer of copper foil is laminated on a tape material immediately after the completion of punching via holes.
Figure 10:
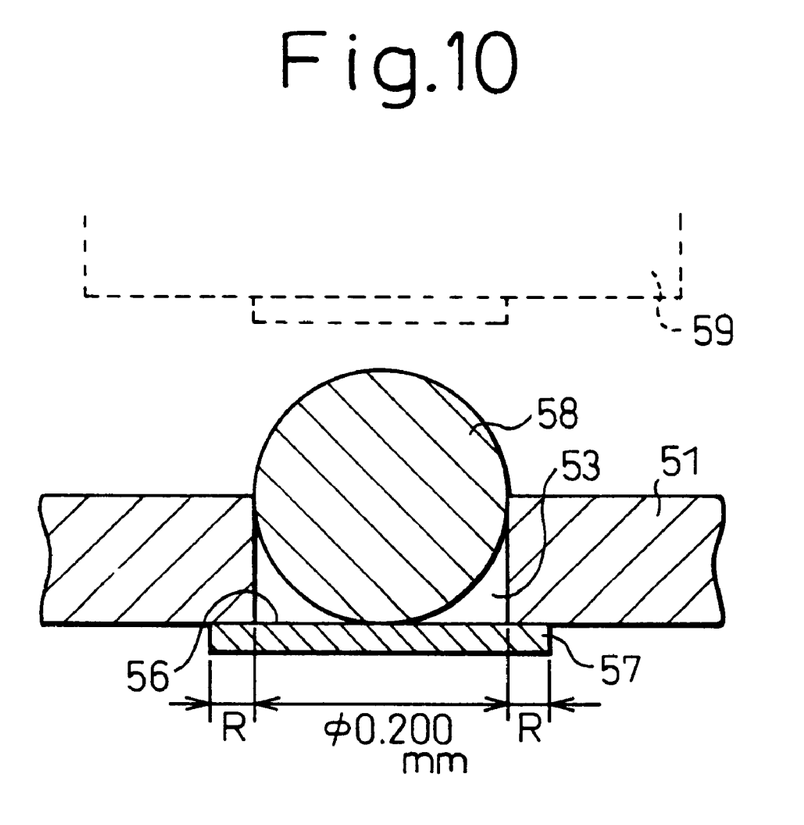
FIG. 10 is a schematic illustration showing a conventional state of joining a solder ball to a via pad.

However, when the tape material 51 is punched from the adhesive layer 52 side in the direction of arrow E, sags are caused on the adhesive layer 52 at the opening edge portion as shown in FIG. 9. Therefore, the adhesive enters the via hole 53. When the layer of copper foil 54 is laminated on the adhesive layer 52 under the condition that the sags are generated on the adhesive layer 52, there is caused a gap 55 between the copper foil 54 and the adhesive layer 52 by the influence of the sags. When the metallic wire 57 including the via pad 56 exposed to the via hole 53 is formed by etching the layer of copper foil 54 as shown in FIG. 10, an adhesive area of the via pad 56 is reduced by the sags of the adhesive layer 52. Accordingly, there is a possibility that the via pad 56 can be peeled off and that the reliability of the package can be deteriorated.

Therefore, for example, when the diameter of the via hole is $\phi 0.200$ mm and consideration is given to the sags of the adhesive layer 52, adhesive region R of the via pad 56 with respect to the tape material 51 must be at least 50 $\mu$m on one side in the radial direction. More preferably, adhesive region R of the via pad 56 with respect to the tape material 51 must be approximately 75 $\mu$m on one side in the radial direction. Unless the above adhesive region R is ensured, it is impossible to maintain the reliability of the package.

As described above, the diameter of the via pad to be joined to the solder ball 58 must be larger than a predetermined value. When the wiring pattern, the wiring pitch of which is made to be fine, is designed, this extended via pad diameter puts a great restriction on the design of the wiring pattern.

In order to join the solder ball 58 to the via pad 56 exposed to the via hole 53 as shown in FIG. 10, when consideration is given to the wettability of the solder and the pad surface, it is necessary that the solder ball 58 comes into contact with the via pad 56. The size of the solder ball 58 is restricted by the via hole diameter, the tape material thickness and the solder ball diameter. In this case, there are two requirements which are incompatible with each other. One requirement is that the via hole diameter tends to be decreased when the pitch of the wiring pattern is made to be fine. The other requirement is that the solder ball diameter is made as large as possible for increasing the height of the solder bump as high as possible when the base board or IC chip 59 is mounted on the solder bump.

In the conventional tape carrier, for example, when the solder ball 58, the diameter of which is not less than $\phi 0.200$ mm, is inserted and jointed to the via hole 53, the diameter of which is $\phi 0.200$ mm, there is a possibility that the solder ball 58 can not be sufficiently joined to the via hole 53. Actually, it is impossible to join the solder ball 58 to the via hole 53. When the thickness of the tape material 51 is decreased to as small as possible, the following problems may be encountered. In general, the tape material 51 is in a belt-shape and moves between the reels. While a predetermined tension is given to the tape, it is conveyed. Therefore, when the mechanical strength of the tape material is lowered, it becomes difficult to convey the tape. For the above reasons, thickness of the tape material 51 can be reduced only to 50 $\mu$m.

SUMMARY OF THE INVENTION

The present invention has been accomplished to solve the above technical problems of the prior art. It is an object of the present invention to provide a tape carrier and a manufacturing method thereof characterized in that: the diameter of the via pad is reduced in order to make the pitch of the wiring pattern to be fine, so that the degree of freedom of designing the fine wiring pattern can be enhanced; and the via pad and the metallic ball can be positively joined to each other even if the diameter of the metallic ball is increased to as large as possible.

In order to accomplish the above object, the present invention is composed as follows.

A tape carrier comprises: a metallic wiring formed on one side of a tape base material through an adhesive layer; and a plurality of via holes are formed on the other side of the tape base material, the via pads of the metallic wiring being exposed to bottom portions of the plurality of via holes, wherein internal wall surfaces of the via holes, which have been formed by punching the tape material, on one side of which the adhesive layer is formed, are subjected to a coining press operation from the other side of the tape base material, so that the via holes are formed into tapered holes, the diameters of the opening portions of which are extended.

The tape material is punched from the side on which the adhesive layer is formed, and sags of the adhesive layer into the via holes, which have been formed in the process of punching, may be pushed back and corrected by the coining press tool.

The internal wall surfaces of the via holes are formed by hot setting of the tape base material when ultrasonic vibration is given to the coining press tool when a coining press operation is conducted from the other side of the tape base material.

Metallic bumps may be joined to the via pads exposed to the bottom portions of the via holes.

The present invention provides a method of manufacturing a tape carrier comprising: a punching process of punching a tape material, on one side of the tape base material of which adhesive is coated, by a press so as to form openings including a plurality of via holes; a laminate process of forming a metallic layer on the adhesive layer of the tape material after the punching process so as to form a tape of three layers; a photolithography process of forming a metallic wiring including via pads exposed to bottom portions of the via holes by etching the metallic layer of the tape of three layers; and a coining press process of conducting a coining press operation on internal wall surfaces of the via holes of the tape material from the other side of the tape base material so as to form the via holes into tapered holes, the diameters of the opening portions of which are extended.

The present invention provides a method of manufacturing a tape carrier according to claim 5, further comprising the steps of: punching the tape material from the side on which the adhesive layer is formed to the side of the tape base material; and conducting a coining press operation in the coining process so that sags of the adhesive layer into the via holes, which are formed when the tape material is punched from the adhesive layer side, can be pushed back in a direction opposite to the punching direction and corrected and so that the via holes can be formed into tapered holes, the diameters of the opening portions of which are extended.

The internal wall surfaces of the via holes are formed by hot setting of the tape base material when ultrasonic vibration is given to a coining tool when coining press is conducted from the side of the tape base material.

The present invention provides a method of manufacturing a tape carrier further comprising a bump forming process in which metallic bumps are joined to the via pads exposed to the via holes after plating has been conducted on the metallic wiring and the via pads.

The coining process may be conducted after the punching process and before the laminate process. Alternatively, the coining process may be conducted after the laminate process and before the photolithography process. Alternatively, the coining process may be conducted after plating has been conducted on the metallic wiring and the via pads. When the tape material is heated while the coining tool is being given ultrasonic vibration, the coining process may be conducted after the completion of the laminate process.

According to the above arrangement, the internal wall surfaces of the via holes formed by punching the tape material, on one side of the tape base material of which the adhesive layer is formed, are subjected to coining press from the other side of the tape base material. Therefore, diameters of the opening portions of the via holes are extended, and the via holes are formed into tapered holes. Therefore, even if the diameters of the via holes are formed to be sufficiently small in order to make the pitch of the wiring to be fine, the via pads can be positively contacted with and joined to the metallic balls.

In order to ensure the mechanical strength of the tape material, the tape thickness is sufficiently large, and the diameters of the metallic balls are increased to as large as possible while the via hole diameters are kept sufficiently small, and the metallic balls are positively contacted with and joined to the via pads. Due to the foregoing, the heights of the metallic bumps to be joined to the semiconductor elements can be made to be sufficiently large.

When the sags generated on the adhesive layer in the via holes in the case of punching the tape material are corrected, the lamination property of the adhesive layer and the metallic layer such as a layer of copper foil can be enhanced in the peripheries of the via holes. Accordingly, even if the pad diameters are reduced to as small as possible, the reliability of the package can be ensured. Therefore, the degree of freedom of designing the fine wiring pattern can be extended.

When the internal wall surfaces of the via holes are subjected to coining press from the base material side of the tape by the coining tool, the coining tool is heated when ultrasonic vibration is being given to the coining tool. Due to the foregoing, the base material of the tape is set by heat, and the shapes of the tapered holes, which have been plastically deformed, can be highly maintained, and the occurrence of spring-back can be prevented, that is, the processing accuracy can be enhanced. When the internal wall surfaces of the via holes are heated while ultrasonic vibration is being given, irregularities on the wall surfaces of the tapered holes, which have been plastically deformed, are made smooth, that is, the wall surfaces of the tapered holes can be finished like a mirror surface. Therefore, it is possible to uniformly join the solder balls to the centers of the via holes.

BRIEF DESCRIPTION OF THE DRAWINGS

These and other objects of the present invention will become apparent from the following detailed description of the preferred embodiments of the invention, taken in connection with the accompanying drawings.

In the drawings.

DETAILED DESCRIPTION OF THE INVENTION

Referring to the accompanying drawings, a preferred example of the tape carrier of the present invention and a preferred example of the method of manufacturing the tape carrier will be explained below in detail.

Figure 1:
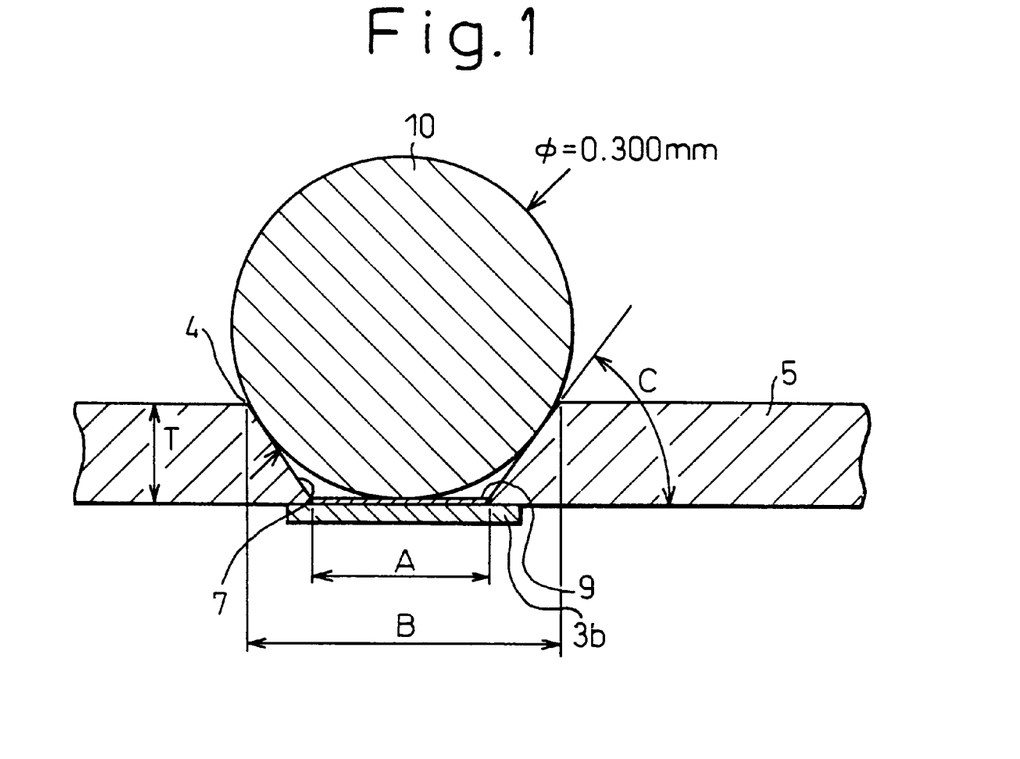
FIG. 1 is a schematic illustration showing a state in which a solder ball is put on a via pad exposed to the bottom portion of a via hole.
Figure 2:
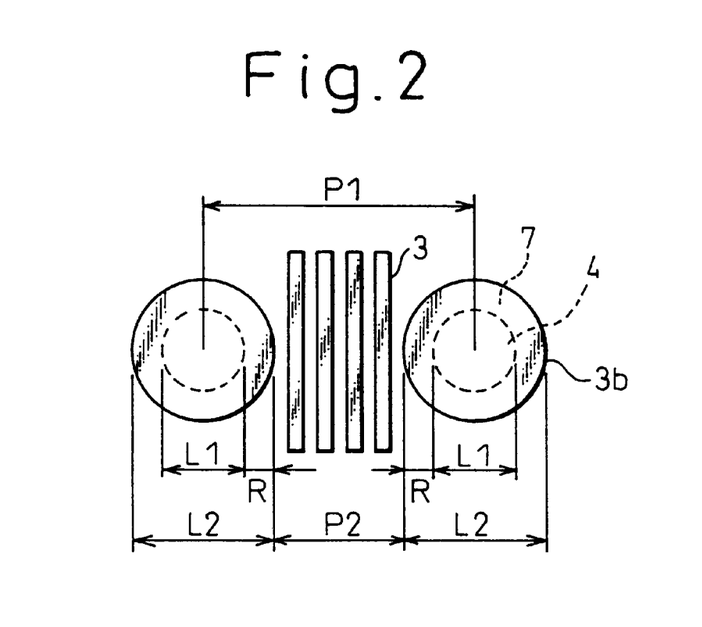
FIG. 2 is a schematic illustration showing via holes and a wiring pattern formed between them.
Figure 3:
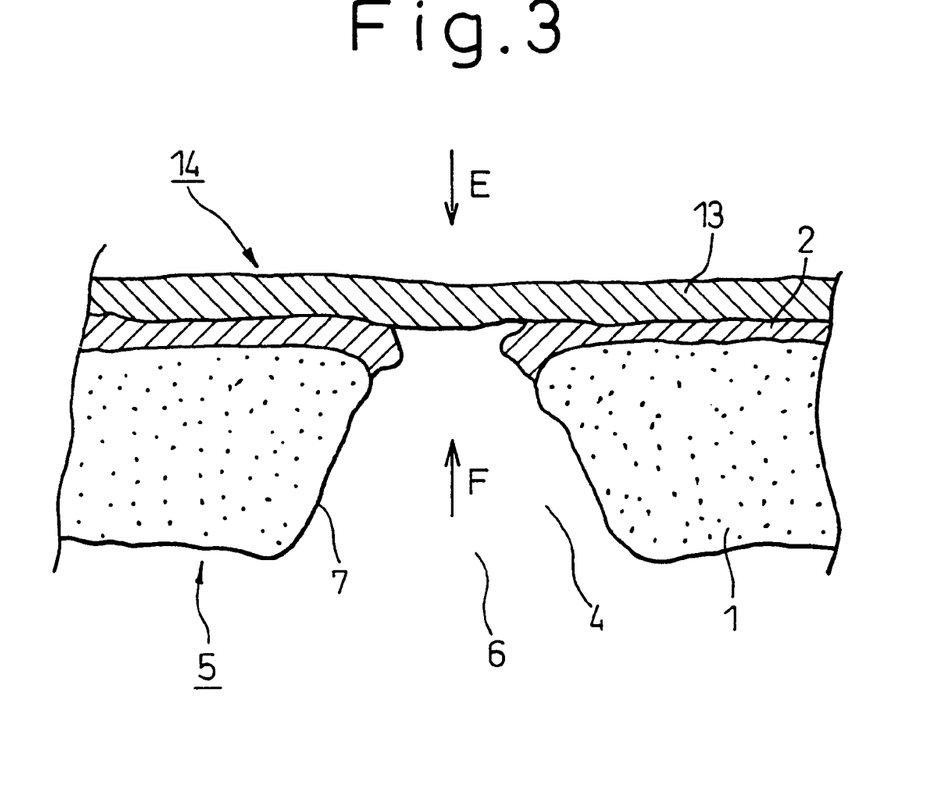
FIG. 3 is an enlarged schematic illustration showing a three layer tape in which a layer of copper foil is laminated on a tape material immediately after the completion of coining press.
Figure 4A:
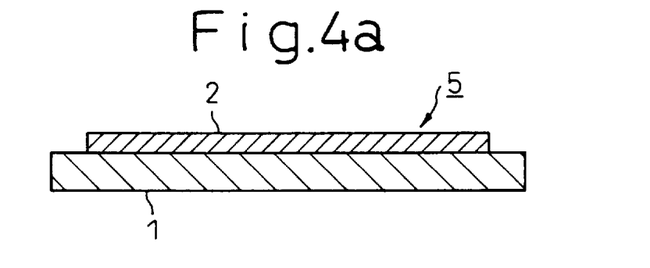
FIGS. 4a–4h are cross-sectional schematic illustrations showing a process of manufacturing a tape carrier.
Figure 4B:
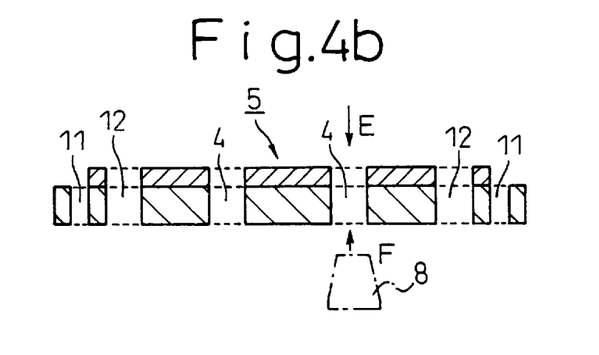
Figure 4C:
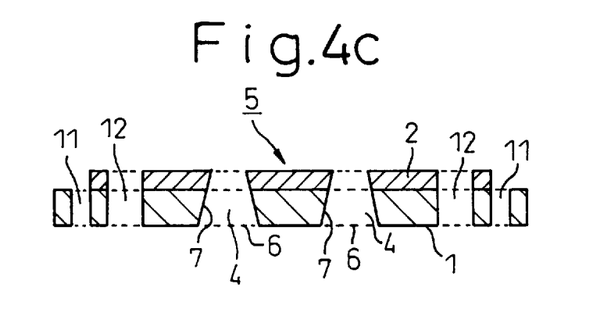
Figure 4D:
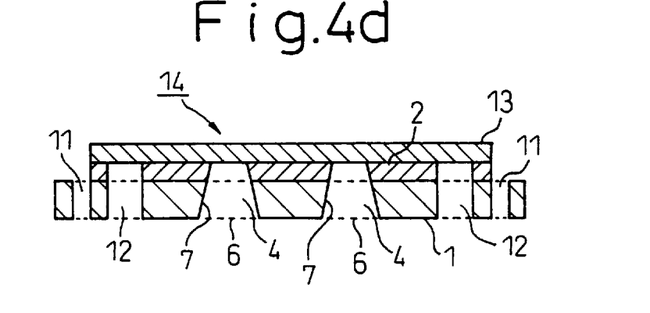
Figure 4E:
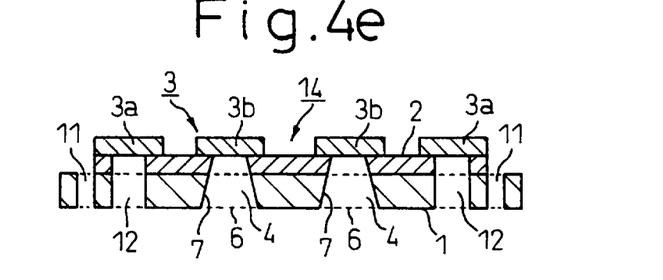
Figure 4F:
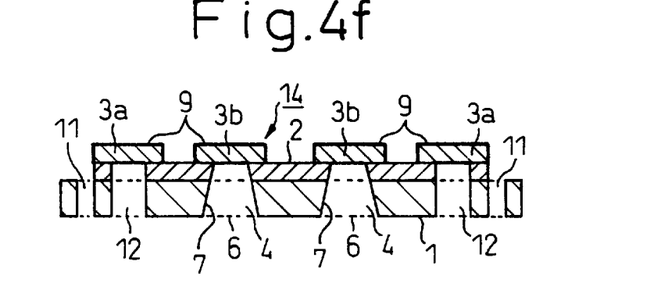
Figure 7:
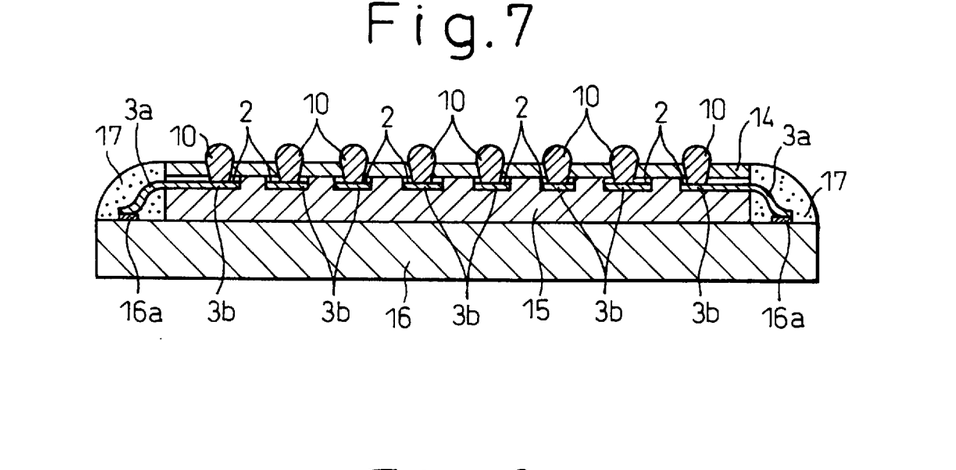
FIG. 7 is a cross-sectional view of the $\mu$BGA type semiconductor device manufactured from the tape carrier shown in FIG. 5, wherein the view is taken on line A—A.
Figure 8:
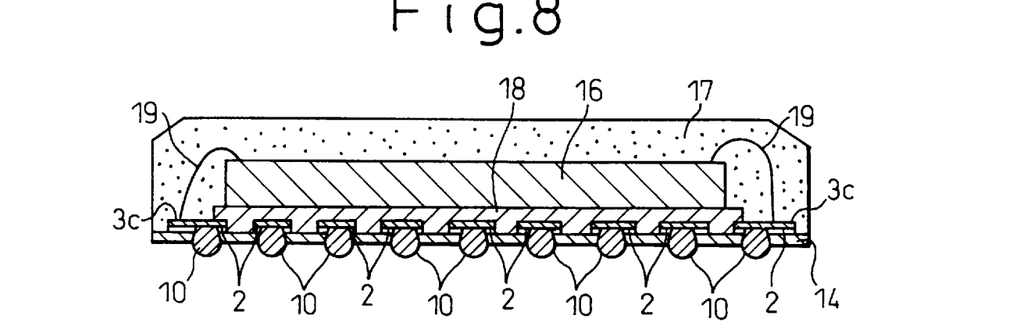
FIG. 8 is a cross-sectional view of the tape BGA type semiconductor device manufactured from the tape carrier of another example.

FIG. 1 is a schematic illustration showing a state in which the solder ball is set on the via pad exposed to the bottom portion of the via hole. FIG. 2 is a schematic illustration showing via holes and a wiring pattern formed between them. FIG. 3 is an enlarged schematic illustration of the tape material on which a layer of copper foil is laminated immediately after the completion of coining press. FIGS. 4a–4h are cross-sectional views for explaining the manufacturing process of the tape carrier. FIG. 5 is a plan view of the tape carrier taken from the metallic wiring side. FIGS. 6a–6h are cross-sectional views for explaining the manufacturing process of the tape carrier of another example. FIG. 7 is a cross-sectional view taken on line A—A of the μBGA type semiconductor device manufactured from the tape carrier shown in FIG. 5. FIG. 8 is a cross-sectional view of the tape BGA type semiconductor device manufactured from the tape carrier of another example.

First, referring to FIGS. 4a–4h, an outline of the structure of the tape carrier will be described below. In this example, description is given to the tape carrier used for the μBGA type semiconductor device. What is called a three layer tape is preferably used for the above tape carrier. This three layer tape is composed in such a manner that adhesive is coated on the base material of the tape, and a layer of copper foil used for wiring is laminated on the base material of the tape through the adhesive layer. The above three layer tape is in a belt shape and moves between reels.

Figure 4G:
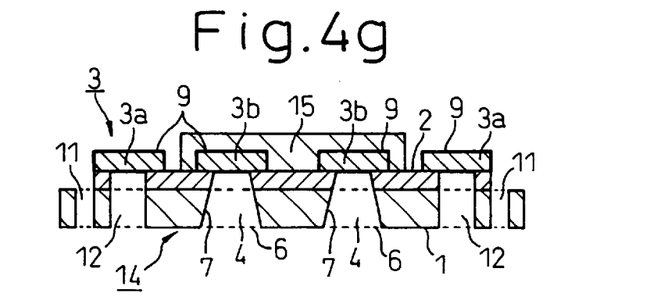
Figure 4H:
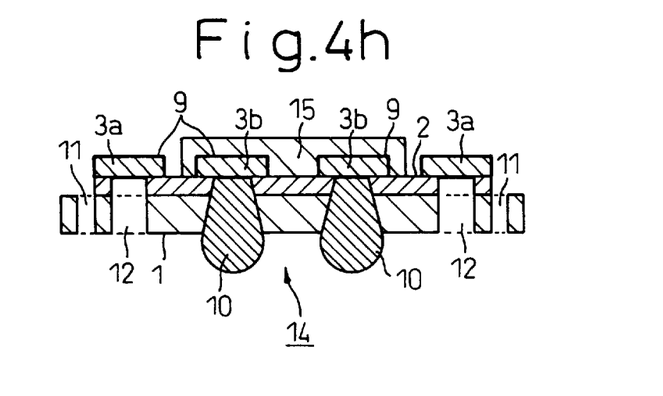
Figure 5:
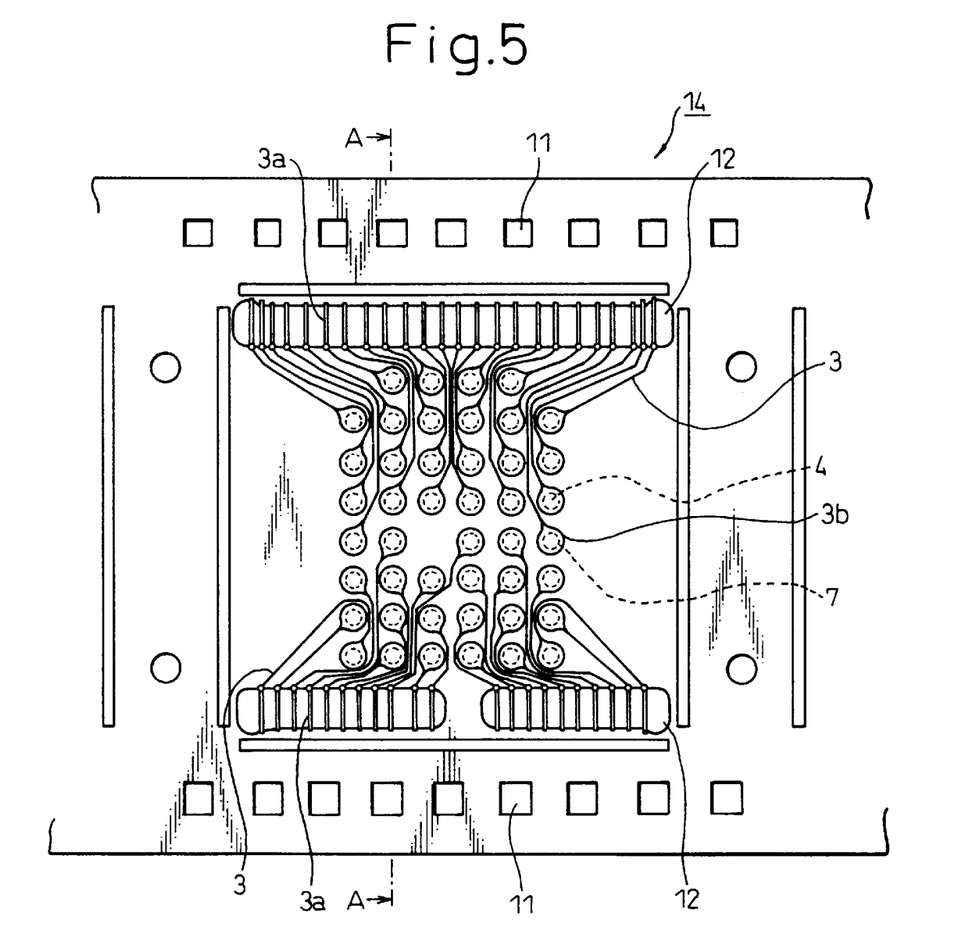
FIG. 5 is a plan view of a tape carrier, wherein the view is taken from the metallic wiring side.

In FIG. 4g, the base material 1 of the tape made of polyimide is coated with adhesive. On this adhesive layer 2, the metallic wiring 3 including the beam leads 3a and the via pads 3b is formed by copper foil. In the above base material of the tape, there are provided a plurality of via holes 4 into which the via pads 3b of the above metallic wiring 3 are exposed.

Concerning the via holes 4 (shown in FIGS. 4a and 4b) formed by punching the tape material 5 in which the adhesive layer 2 is laminated on the base material 1 of the tape, the internal wall surfaces of the via holes are subjected to coining press from the side of the base material 1 of the tape, so that the tapered holes 7 are formed, the opening portions of which are extended. Specifically, sags of the adhesive layer 2 into the via holes 4, which are formed when the tape material 5 is punched from the adhesive layer 2 side in the direction of arrow E, are corrected by conducting the coining press with the coining tool 8 so that the sags can be pushed back and corrected in the direction of F opposite to the punching direction described above. Due to the foregoing, the internal wall surfaces of the via holes are formed into the tapered holes 7, the opening end portions 6 of which are extended (shown in FIGS. 4b and 4c).

The metallic wiring 3 including the beam leads 3a and the via pads 3b is subjected to metallic plating 9 such as tin plating, solder plating, nickel plating or gold plating. The solder balls 10 are joined to the via pads 3b, so that the metallic bumps are formed (shown in FIG. 4h).

Referring to FIGS. 4a–4h and FIG. 5, the manufacturing process of the above tape carrier will be explained as follows. FIGS. 4a–4h are views showing the principle of the process of manufacturing the tape carrier. Therefore, the number of the via holes of the tape carrier shown in FIGS. 4a–4h is different from the number of the via holes actually formed in the tape carrier exemplarily shown in FIG. 5.

First, in FIG. 4a, one side of the tape base material 1 made of resin such as polyimide is coated with adhesive, and the tape material 5, the state of which is like B-stage, is formed.

Next, in FIG. 4b, the tape material 5 is conveyed to a press not shown having a punch and die and punched in the direction of arrow E. In this way, the opening portion including a plurality of via holes 4 is formed. In this case, when the tape material 5 is punched from the other side of the tape material 5, that is, when the tape material 5 is punched from the side of the tape base material 1, a burr on the adhesive layer 2 is formed. Therefore, punching is commonly conducted from the side on which the adhesive layer is formed. When it is used for μBGA, not only the via holes 4 but also the sprocket holes 11 for conveying the tape material 5 and the beam lead windows 12 for cutting the beam leads are formed as the opening portion.

After the via holes 4 have been punched, sags of the adhesive layer 2 are caused in the above tape material 5. Therefore, the adhesive enters the inside of the via holes. Due to the sags of the adhesive layer 2, gaps are caused in the later process in which copper foil is made to adhere onto the adhesive layer 2. Accordingly, the layers are not sufficiently laminated to each other. As a result, adhesion of the via pads 3b is deteriorated. For the above reasons, there is a possibility that the layers are peeled off, and that the reliability of the package is lowered.

In order to ensure the reliability of the package, it is necessary to ensure a difference of at least 75 μm between the outer diameter of the via hole and the outer diameter the via pad. Therefore, the diameter of the via pad 3b to which the solder ball is joined must be extended, and also the pitch between the solder balls 10 must be extended, which puts a great restriction on the design of the wiring pattern, the pitch of which must be made fine.

In order to solve the above problems, for the purpose of correcting the sags of the adhesive layer 2, using the coining tool 8 as shown in FIG. 4b, coining press is conducted in the direction of arrow F from the reverse side to the punching direction of the via hole 4 of the three layer tape 5, that is, coining press is conducted from the side of the tape base material 1. As a result, the tapered hole 7, the diameter of the opening portion 6 of which is extended, is formed on the internal wall surface of the via hole as shown in FIG. 4c. Punching and coining conducted by the press may be conducted when the tape material 5 to be continuously conveyed passes through a progressive metallic die.

Due to the foregoing, the sags of the adhesive layer 2 into the via holes 4 are pushed back and corrected by the coining tool 8. Therefore, the gaps between the adhesive layer and the layer of copper foil 13 can be substantially reduced. At the same time, a burr caused in the tape base material 1 can be corrected as shown in FIG. 3.

Even if the diameters of the via holes are decreased in order to make the pitch of the wiring pattern fine, it is possible to extend the diameters of the solder balls to as large as possible for ensuring the height of the bumps used when the semiconductor elements such as IC chips are mounted.

In this connection, concerning the punching direction of the tape material 5, as long as a burr caused on the adhesive layer 2 can be corrected, it is possible to use a tape material 5 in which punching is conducted in the direction of arrow F from the side of the tape base material 1.

Next, as shown in FIG. 4d, the layer of copper foil 13 to be used as metallic material is laminated on the adhesive layer 2 formed on the tape material 5 after the completion of coining, so that the three layer tape 14 can be formed. Specifically, the layer of copper foil 13 is put on the adhesive layer 2 and heated so that the two layers can be made to adhere to each other.

Next, in FIG. 4e, the above three layer tape 14 is subjected to the photolithographic process, so that the metallic wiring 3 can be formed. The specific operation is conducted as follows. A photoresist is coated on the layer of copper foil 13 of the three layer tape 14, and exposure development is conducted through a glass mask. In this way, resist is formed according to the wiring pattern. Next, a backup coating is conducted on the tape base material 1 side. After that, the copper foil 13 is etched, so that the unnecessary copper foil 13 exposed by the resist surface is removed. Further, the above resist is peeled off. In this way, the metallic wire 3 having the beam leads 3a and the via pads 3b can be formed.

In FIG. 4f, metallic plating 9 is conducted on the surface of the metallic wiring 3 made of copper foil for the prevention of corrosion. Examples of this metallic plating are: tin plating, solder plating, nickel plating and gold plating. In this connection, depending upon the thickness of the three layer tape 14, the internal wall surfaces of the via holes 4 may be subjected to the above metallic plating 9 if possible.

In the tape carrier used for μBGA, elastomer 15 is made to adhere onto the metallic wiring side of the above three layer tape 14 in FIG. 4g, and an adhesive layer is formed on the elastomer 15.

The thus formed tape carrier is exemplarily shown in FIG. 5.

Next, referring to FIG. 7, a semiconductor device of the μBGA type manufactured from the tape carrier shown in FIG. 5 will be explained as follows. Under the condition of the tape carrier shown in FIG. 4g, the semiconductor chip 16 is made to adhere to the elastomer 15, which has been formed on the metallic wiring 3 of the three layer tape 14, through an adhesive layer. The beam leads 3a arranged at the beam lead windows 12 are pushed by a bonding tool not shown, so that the lead portion is cut off from the three layer tape 14. At the same time, when the forward end portions of the leads are pushed and bent by the forward end surface of the bonding tool, they are joined to the electrode terminals 16a of IC chip 16. The above joining is conducted by the bonding tool by means of a heat-crimp in which ultrasonic waves are also used.

The thus joined beam lead portion 3a is sealed as follows. Sealing resin 17 is coated along the outer periphery of the semiconductor chip 16 by a dispenser, so that the exposed portions of the beam lead 3a and the electrode terminal 16a can be sealed by resin.

Next, the solder balls 10 are inserted into the via holes 4 of the above three layer tape 14. Then, the solder balls 10 and the via holes 4 are heated and joined to each other. In this way, the semiconductor device is formed.

In this connection, if necessary, the metallic bumps may be formed under the condition of the tape carrier shown in FIG. 4g. In this case, joining is conducted as follows. The solder balls 10 are inserted into the via holes 4 of the three layer tape 14 and made to reflow in FIG. 4h. Alternatively, the three layer tape 14 is set so that the metallic wiring 3 can be located on a stage heater not shown in the drawing, and the solder balls 10 are inserted into the via holes 4 and heated.

In order to make the wiring pitch fine in the process of manufacturing the above tape carrier, it is preferable that the diameter of the via hole 4 is made as small as possible and the diameter of the solder ball is made as large as possible so that the height can be ensured. Referring to FIG. 1, sizes of the solder ball 10 and the via hole 4, into which the solder ball 10 is inserted, are exemplarily shown. In FIG. 1, the thickness T of the tape material 5 is 87 μm, the diameter of the hole on the bottom side of the via hole 4 is A, the diameter of the hole on the opening portion side is B, and the taper angle is C.

For example, in the conventional via hole in which the bottom portion diameter A=the opening portion diameter B=ϕ0.200 μm, even if the solder ball 10, the diameter of which is ϕ0.300 μm, is inserted into the via hole, it is impossible for the solder ball 10 to come into contact with the via pad 3b. Therefore, the solder ball 10, the diameter of which is different from the above hole diameter, can not be soldered to the via pad 3b. On the other hand, in this example, the internal wall surface of the via hole is formed in such a manner that the diameter of the opening portion 6 is extended, that is, the via hole is formed into a tapered hole 7 (the taper angle C=36.87°). Therefore, even if the diameter A of the hole in the bottom portion=ϕ0.200 μm, it is possible that the diameter B of the hole of the opening portion= ϕ0.432 μm. Accordingly, the solder ball 10 can be positively contacted with the via pad 3b.

Due to the foregoing, when the diameter A in the bottom portion of the via hole 4 is reduced to as small as possible, the solder ball 10, the diameter of which is as large as possible, can be soldered to the via pad 3b. Therefore, the degree of freedom of designing the fine wiring pattern can be enhanced, and further a sufficient height of the solder bump can be ensured to mount IC chips.

In this connection, the diameter A of the via hole 4 in the bottom portion, the diameter B in the opening portion and the taper angle C can be variously changed according to the thickness T of the tape material 5. However, when consideration is given to the mechanical strength of the three layer tape 15, the thickness T must be at least 50 μm, and it is preferable that the thickness T of the tape material is determined to be as large as possible.

Referring to FIG. 2, the sizes of the via hole, the via pad and the adhesive region of the via pad are exemplarily shown in the case of a certain solder ball pitch.

In FIG. 2, a description is given on the assumption that the equation P1=L2+P2 is established, wherein P1 is a solder ball pitch, P2 is a via pad pitch, L1 is a via hole diameter (diameter of the bottom portion), L2 is a via pad diameter, and R is an adhesive region on one side of the via pad 3b in the radial direction.

For example, when the solder ball pitch P1 is 0.50 mm and the via hole bottom portion diameter L1 is 0.230 mm, the via pad diameter L2 is 0.380 mm and the via pad pitch P2 is 0.120 mm, design is conducted so that the wiring pitch (line and space) of the metallic wiring 3 can be 0.030 mm.

In this case, according to the conventional method of design, the via pad diameter L2=L1+0.150 mm. Therefore, the adhesive region R of the via pad 3b is designed to be R=0.075 mm, and the number of the metallic wire 3 arranged between the via pads 3b, 3b is only one at most when consideration is given to line and space.

On the other hand, according to the present invention, the gap between the adhesive layer 2 and the via pad 3b, which has been caused in the process of punching the tape material 5, is corrected by coining press. Therefore, the via pad diameter can be reduced to as small as possible. For example, the limit of the adhesive region R of the via pad 3b is conventionally 75 $\mu$m. However, according to this example, it is possible to design the adhesive region R of the via pad 3b to be about 50 $\mu$m. That is, it is possible for L2=L1+0.100 mm. In this case, the adhesive region R of the via pad 3b is designed to be R=0.050 mm. Therefore, in FIG. 2, the via pad pitch P2 is extended and P2=0.120 mm+0.050 mm=0.170 mm. Therefore, even if the wiring pitch (line and space) of the metallic wires 3 is 0.033 mm, it is possible to arrange two electric wires.

Accordingly, when coining press is conducted so that the sags of the adhesive layer 2 into the via hole 4 can be pushed back after the completion of punching the tape material 5, the via pad 3b and the periphery of the bottom portion of the via hole 4 can be sufficiently laminated on each other. Therefore, the via pad diameter can be reduced to as small as possible. Consequently, it is unnecessary that the wiring width is decreased too small and the wiring is drawn around, and the degree of freedom of designing the fine wiring pattern can be extended.

In the above example, coining press is conducted immediately after the completion of punching the tape material 5. However, when the lamination of the copper foil 13 becomes insufficient because of a swell in the thickness of the tape material 5 caused by coining press, coining press may be conducted after the laminate process, in which the copper foil 13 is made to adhere onto the adhesive layer 2, before the process of photolithography. In order to avoid the influence caused by the moisture absorption and expansion of the tape material 5, coining press may be conducted after the process of metallic plating in which the metallic wiring 3 and the via pads 3b are subjected to metallic plating.

In the case where the process of coining press is performed after the laminate process, it is preferable that the coining tool 8 is given ultrasonic vibration during the process of coining press. The reason is described as follows. When coining press, which is accompanied by the ultrasonic vibration, is conducted on the tape material 5 before the laminate process, the adhesive layer 2 is hardened. Accordingly, there is a possibility that the copper foil 13 can not be made to adhere onto the adhesive layer sufficiently. Specifically, when coining press is conducted on the via hole 4 of the three layer tape 14 by the bonding tool 8 from the side of the tape base material 1, the wall surface of the tapered hole 7 is hardened by heating the tape base material 1 to about 200° C.

Referring to FIGS. 6a–6h, the method of manufacturing the above tape carrier will be explained below. In this connection, like reference characters are used to indicate like parts in FIGS. 4a–4h and FIGS. 6a–6h in this explanation.

Figure 6A:
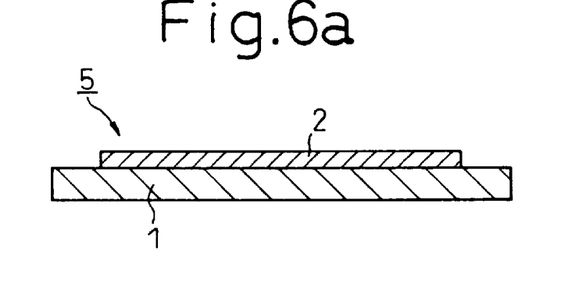
FIGS. 6a–6h are cross-sectional schematic illustrations showing a process of manufacturing a tape carrier of another example.

First, in FIG. 6a, one side of the tape base material 1 made of resin such as polyimide is coated with adhesive, and the tape material 5, the state of which is like B-stage, is formed.

Figure 6B:
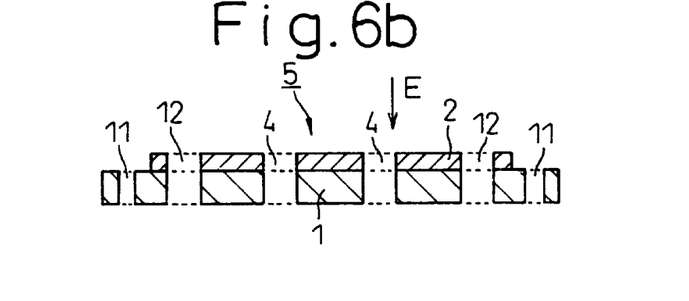

Next, in FIG. 6b, the tape material 5 is conveyed to a press not shown having a punch and die and punched in the direction of arrow E. In this way, the opening portion including a plurality of via holes 4 is formed. In this case, when the tape material 5 is punched from the other side of the tape material 5, that is, when the tape material 5 is punched from the side of the tape base material 1, a burr of the adhesive layer 2 is caused. Therefore, punching is commonly conducted from the side on which the adhesive layer is formed. When it is used for $\mu$BGA, not only the via holes 4 but also the sprocket holes 11 for conveying the tape material 5 and the beam lead windows 12 for cutting the beam leads are formed as the opening portion.

Figure 6C:
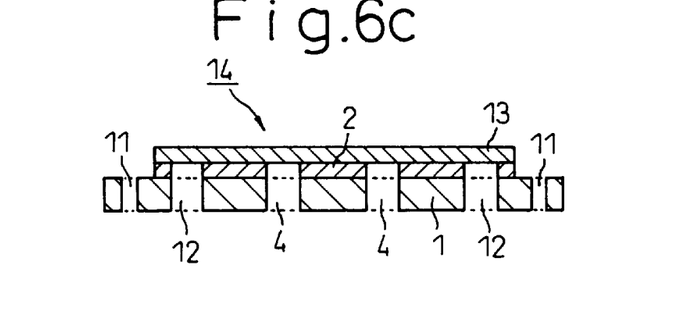
Figure 6D:
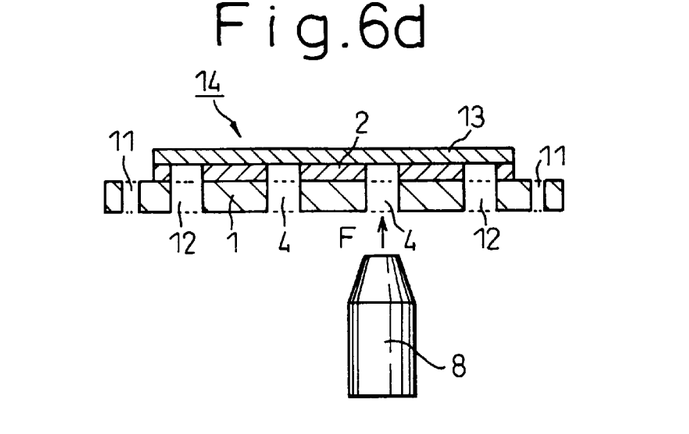
Figure 6E:
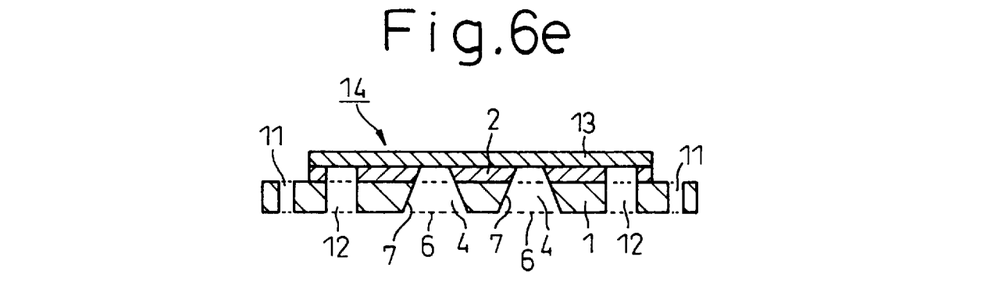

Next, as shown in FIG. 6c, the layer of copper foil 13 is laminated on the adhesive layer 2 formed on the tape material 5 after the completion of coining, so that the three layer tape 14 is formed. Specifically, the layer of copper foil 13 is put on the above adhesive layer 2 and heated so that both layers can be made to adhere to each other.

After the via holes 4 have been punched, sags of the adhesive layer 2 are caused in the above tape material 5. Therefore, the adhesive enters the inside of the via holes 4. Due to the sags of the adhesive layer 2, gaps are caused in the later process in which the layer of copper foil is made to adhere to the adhesive layer 2. Accordingly, the layers are not sufficiently laminated on each other. As a result, adhesion of the via pads 3b is deteriorated. For the above reasons, there is a possibility that the layers are peeled off, and the reliability of the package is lowered. In order to ensure the reliability of the package, when a sufficiently large difference between the outer diameter of the via hole and the outer diameter the via pad is ensured, a great restriction is put on the design of the wiring pattern, the pitch of which must be made fine.

In order to solve the above problems, for the purpose of correcting the sags of the adhesive layer 2, using the coining tool 8 as shown in FIG. 6b, coining press is conducted in the direction of arrow F from the reverse side to the punching direction of the via hole 4 of the three layer tape 14, that is, coining press is conducted from the side of the tape base material 1. At this time, when ultrasonic vibration is given to the coining tool 8 by an ultrasonic oscillator not shown in the drawing, coining press is conducted while the tape base material 1 is being heated to about 200° C. and hardened. Due to the foregoing, the internal wall surface of the via hole is formed into a tapered hole 7, the opening portion 6 of which is extended. Taper angle C (shown in FIG. 1) of this tapered hole 7 can be formed with high accuracy into an arbitrary angle (for example 30° to 45°), and no change with time occurs in this taper angle C. Punching and coining may be conducted by the above press when the tape member 5, which is continuously conveyed, passes through a progressive metallic die.

In the above coining process, intrusion of the adhesive layer 2 forming the three layer tape 14 into the via hole 4 can be pushed back and corrected by the coining tool 8. Therefore, the problem of the gap between the adhesive layer 2 and the layer of copper foil 13, to which the adhesive layer 2 adheres, can be substantially solved, and even if a burr is generated in the tape base material 1, it can be corrected. At this time, resin of the tape base material 1 is heated and hardened while it is plastically deformed into the tapered shape. Therefore, the tapered shape can be stably maintained over a long period of time. Therefore, it is possible to prevent the tapered shape from returning to the initial shape by the action of spring-back of the tape base material 1. Accordingly, the accuracy can be maintained high when the tapered shape is formed. Further, the occurrence of irregularities caused by a swell of thickness in the coining process can be prevented, and the tapered surface can be finished as a mirror surface. Accordingly, the solder ball 10 can be uniformly joined at the center of the tapered hole 7.

Compared with a case in which the tapered hole 7 is formed while the three layer tape 14 is being plastically deformed by a metallic press die being heated and hardened, it is unnecessary to keep the metallic press die at high temperature. Accordingly, it is possible to avoid the deterioration of processing accuracy caused by thermal expansion of the metallic press die.

Figure 6F:
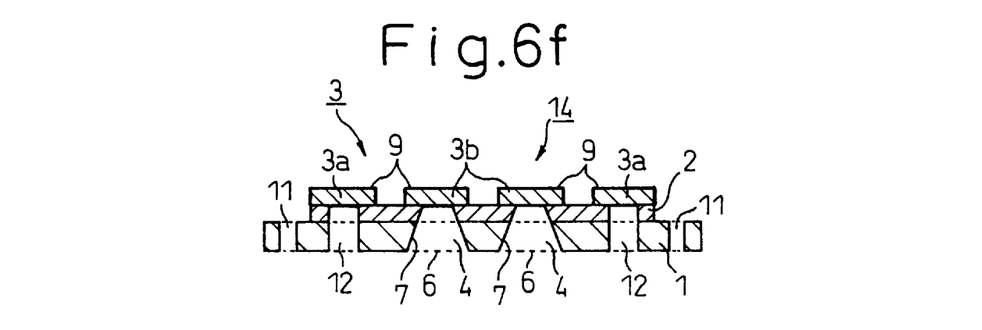

Next, in FIG. 6f, the above three layer tape 14 is subjected to the photolithographic process, so that the metallic wiring 3 can be formed. The specific operation is conducted as follows. Photoresist is coated on the layer of copper foil 13 of the three layer tape 14, and exposure development is conducted through a glass mask. In this way, resist is formed according to the wiring pattern. Next, backup coating is conducted on the tape base material 1 side. After that, the copper foil 13 is etched, so that the unnecessary copper foil 13 exposed by the resist surface is removed. Further, the above resist is peeled off. In this way, the metallic wire 3 having the beam leads 3a and the via pads 3b can be formed.

Metallic plating 9 is conducted on the surface of the metallic wiring 3 made of copper foil 13 for the prevention of corrosion. Examples of this metallic plating are: tin plating, solder plating, nickel plating and gold plating. In this connection, depending upon the thickness of the three layer tape 14, the internal wall surfaces of the via holes 4 may be subjected to the above metallic plating 9 if possible.

Figure 6G:
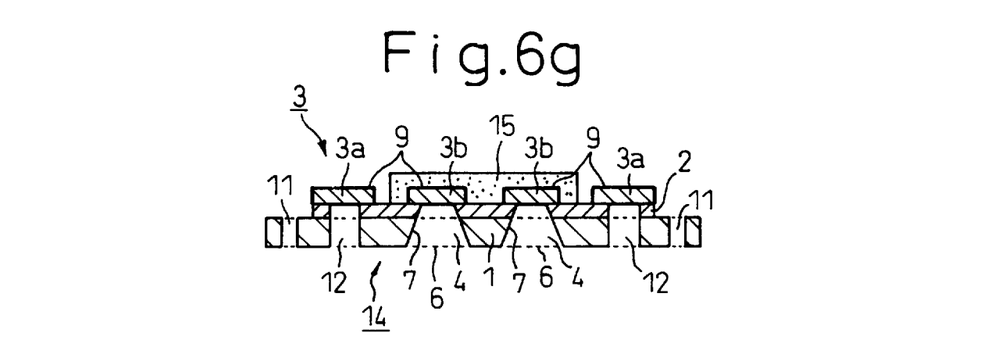
Figure 6H:
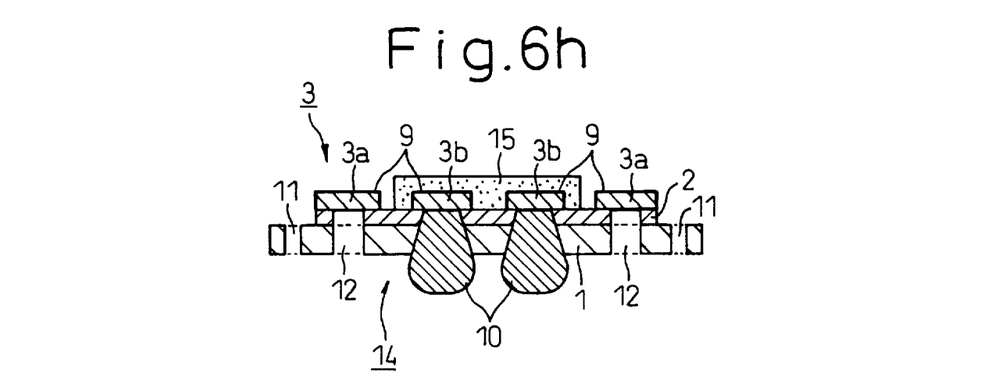

In the tape carrier used for $\mu$BGA, elastomer 15 is made to adhere onto the metallic wiring side of the above three layer tape 14 in FIG. 6g, and an adhesive layer is formed on the elastomer 15.

In this connection, under the condition of the tape carrier shown in FIG. 6g, the metallic bumps may be formed if necessary. In this case, joining is conducted as follows. The solder balls 10 are inserted into the via holes 4 of the three layer tape 14 and made to reflow in FIG. 6h. Alternatively, the three layer tape 14 is set so that the metallic wiring 3 can be located on a stage heater not shown in the drawing, and the solder balls 10 are inserted into the via holes 4 and heated.

As described above, the present invention relates to a method of manufacturing the $\mu$BGA type tape carrier in which one sheet of three layer tape 14 is used. However, is it possible to apply the present invention to a case in which a plurality of three layer tapes 14 are laminated on each other so that a multiple layer type tape carrier can be formed.

The tape carrier of the present invention and the manufacturing method thereof can be applied to not only the $\mu$BGA type tape carrier but also, for example, the tape carrier for manufacturing the tape BGA type semiconductor device. In this case, in the manufacturing process of the tape carrier, after patterning of the metallic wiring 3 has been conducted in the same process as that of the $\mu$BGA type (shown in FIGS. 4a–4e and FIGS. 6a–6f), the metallic wiring 3 except for the electrode terminal 3c is covered with the solder resist 18, and then the electrode terminal 3c exposed outside is subjected to nickel plating or gold plating for the prevention of corrosion. In this connection, in the case of the tape BGA type, the beam lead window 12 is omitted in the process of punching the tape material 5.

Another example of the semiconductor device manufactured from the above tape carrier will be explained referring to the FIG. 8. The semiconductor chip 16 is made to adhere onto the solder resist 18 of the tape carrier through a certain material (DIATOUCH) not shown in the drawing. Then, wire bonding is conducted, and the electrode terminal (not shown) of the semiconductor chip 16 and the electrode terminal 3c of the three layer tape 14 are electrically connected with each other by the bonding wire 19 made of gold or others. Further, the mounting surface of the semiconductor chip 16 is sealed with sealing resin 17.

Next, the solder ball 10 is inserted into the via hole 4 on the three layer tape 14 and heated. In this way, the solder ball 10 is joined to the via hole 4, and the tape BGA type semiconductor device can be manufactured.

As described above, the tape carrier of the present invention can be preferably applied to the manufacture of various type tape carrier packages. Of course, variations may be made without departing from the spirit and scope of the present invention.

As described above, according to the present invention, the tape material, on one side of the tape base material of which the adhesive layer is formed, is punched so as to form via holes, and the internal wall surfaces of the via holes are subjected to coining press from the other side of the tape base material, so that the via holes are formed into tapered holes, the diameters of the opening portions of which are extended. Therefore, even if the diameters of the via holes are sufficiently reduced so as to make the pitch of the wiring pattern fine, the via pads and the metallic balls are positively contacted and joined to each other.

Even if the thickness of the tape material is sufficiently large so as to ensure the mechanical strength of the tape material, it is possible to make the diameters of the metallic balls as large as possible while the via hole diameters are kept sufficiently small, and the metallic balls can be positively contacted with the via pads. Accordingly, the heights of the metallic bumps to be joined to the semiconductor elements can be kept sufficiently large.

Sags of the adhesive layer generated in the via holes in the process of punching the tape material can be corrected, and the adhesive layer and the layer of copper foil are sufficiently laminated on each other in the peripheries of the via holes. Therefore, even if the via hole diameters are decreased to as small as possible, the reliability of the package can be maintained high. Accordingly, the degree of freedom can be extended when the fine wiring pattern is designed.

When the internal wall surfaces of the via holes are subjected to coining press from the base material side of the tape by the coining tool, ultrasonic vibration is given to the coining tool, so that the coining tool is heated. Therefore, the base material of the tape is heated and hardened while it is plastically deformed into the tapered shape. Therefore, the shape of the tapered hole can be stably maintained over a long period of time. Therefore, it is possible to prevent the tapered shape from returning to the initial shape by the action of spring-back of the tape base material. Accordingly, the accuracy can be maintained high when the tapered shape is formed. Further, the occurrence of irregularities caused by the swell of thickness in the coining process can be prevented, and the tapered surface can be finished like a mirror surface. Accordingly, the solder balls can be uniformly joined at the centers of the via holes.

It is to be understood that the present invention is by no means limited to the specific embodiments as illustrated and described herein, and that various modifications thereof may be made which come within the scope of the present invention as defined in the appended claims.

What is claimed is:

1. A method of manufacturing a tape carrier comprising:
   a punching process for punching a tape material, which comprises a tape base material on one side of which adhesive is coated, by a press so as to form openings including a plurality of via holes;

a laminate process of forming a metallic layer on the adhesive layer of the tape material after the punching process so as to form a tape of three layers;

a photolitography process for forming a metallic wiring including via pads exposed to bottom portions of the via holes by etching the metallic layer of the tape of three layers; and a coining press process for conducting a coining press operation on internal wall surfaces of the via holes of the tape material from the other side of the tape base material so as to form the via holes into tapered holes having opening portions the diameters of which are extended.

2. The method for manufacturing a tape carrier according to claim 1, further comprising the steps of:

punching the tape material from the side on which the adhesive layer is formed to the side of the tape base material; and conducting a coining press operation in the coining process so that sags of the adhesive layer into the via holes, which are formed when the tape material is punched from the adhesive layer side, can be pushed back in a direction opposite to the punching direction and corrected and so that the via holes can be formed into tapered holes having opening portions the diameters of which are extended.

3. The method for manufacturing a tape carrier according to claim 1, wherein the internal wall surfaces of the via holes are formed by hot setting of the tape base material when ultrasonic vibration is given to a coining tool when coining press is conducted from the side of the tape base material.

4. The method for manufacturing a tape carrier according to claim 1, further comprising a bump forming process in which metallic bumps are joined to the via pads exposed to the bottom portions of the via holes after plating has been conducted on the metallic wiring and the via pads.

5. The method for manufacturing a tape carrier according to claim 1, wherein the coining process is conducted after the punching process and before the laminate process.

6. The method for manufacturing a tape carrier according to claim 1, wherein the coining process is conducted after the laminate process and before the photolithography process.

7. The method for manufacturing a tape carrier according to claim 1, wherein the coining process is conducted after plating has been conducted on the metallic wiring and the via pads.

* * * * *